United States Patent [19]

Weisbrod

[11] Patent Number: 5,781,139
[45] Date of Patent: Jul. 14, 1998

[54] SWITCHED CAPACITOR DIGITAL-TO ANALOG CONVERTER

[75] Inventor: Sherman Weisbrod, Skillman, N.J.

[73] Assignee: Thomson multimedia S.A., Boulogne, France

[21] Appl. No.: 618,222

[22] Filed: Mar. 19, 1996

[51] Int. Cl.$^6$ .................................................. H03M 1/66
[52] U.S. Cl. ................................. 341/150; 341/146
[58] Field of Search ................................. 341/145, 146, 341/150

[56] References Cited

U.S. PATENT DOCUMENTS

| | | | |
|---|---|---|---|
| 3,665,485 | 5/1972 | Mulkey et al. | 341/150 |
| 4,337,459 | 6/1982 | Takahasi et al. | |
| 4,412,208 | 10/1983 | Akazawa et al. | |
| 4,451,820 | 5/1984 | Kapral | |
| 4,517,551 | 5/1985 | Campbell, Jr. | |
| 4,584,568 | 4/1986 | Zomorrodi | |
| 4,611,194 | 9/1986 | Shosaku | |
| 4,661,802 | 4/1987 | Yukawa | |
| 4,667,179 | 5/1987 | Law et al. | |
| 4,872,011 | 10/1989 | Pelgrom et al. | 341/150 |
| 4,873,525 | 10/1989 | Iida | 341/145 |
| 4,888,587 | 12/1989 | Kuraishi | 341/122 |
| 4,937,578 | 6/1990 | Shioda | 341/150 |
| 4,968,989 | 11/1990 | Olmstead et al. | 341/150 |
| 5,008,674 | 4/1991 | Da Franca et al. | 341/150 |
| 5,057,838 | 10/1991 | Tsuji et al. | 341/133 |
| 5,332,997 | 7/1994 | Dingwall et al. | 341/150 |
| 5,453,757 | 9/1995 | Date et al. | 341/150 |

*Primary Examiner*—Marc S. Hoff
*Attorney, Agent, or Firm*—Joseph S. Tripoli; Joseph J. Laks; Sammy S. Henig

[57] ABSTRACT

In a switched capacitor type digital-to-analog (D/A) converter, a group of n bits of the binary word are applied to n parallel branches of the D/A converter, respectively. In a given branch, the corresponding bit is applied to a control terminal of a corresponding switch associated with a corresponding switched capacitor. Depending on the logic level of the bit, the switched capacitor is charged to a reference voltage or remains discharged. Then, the switched capacitor of the given branch is coupled by a transfer switch in parallel with a summing capacitor to provide for charge redistribution. The capacitances of the switched capacitor and of the summing capacitor are equal. The time allocated for either discharging the switched capacitor or charge redistribution is made shorter than the time allocated for charging the capacitor. Charging/discharging the capacitor is accomplished via a common transistor.

9 Claims, 3 Drawing Sheets

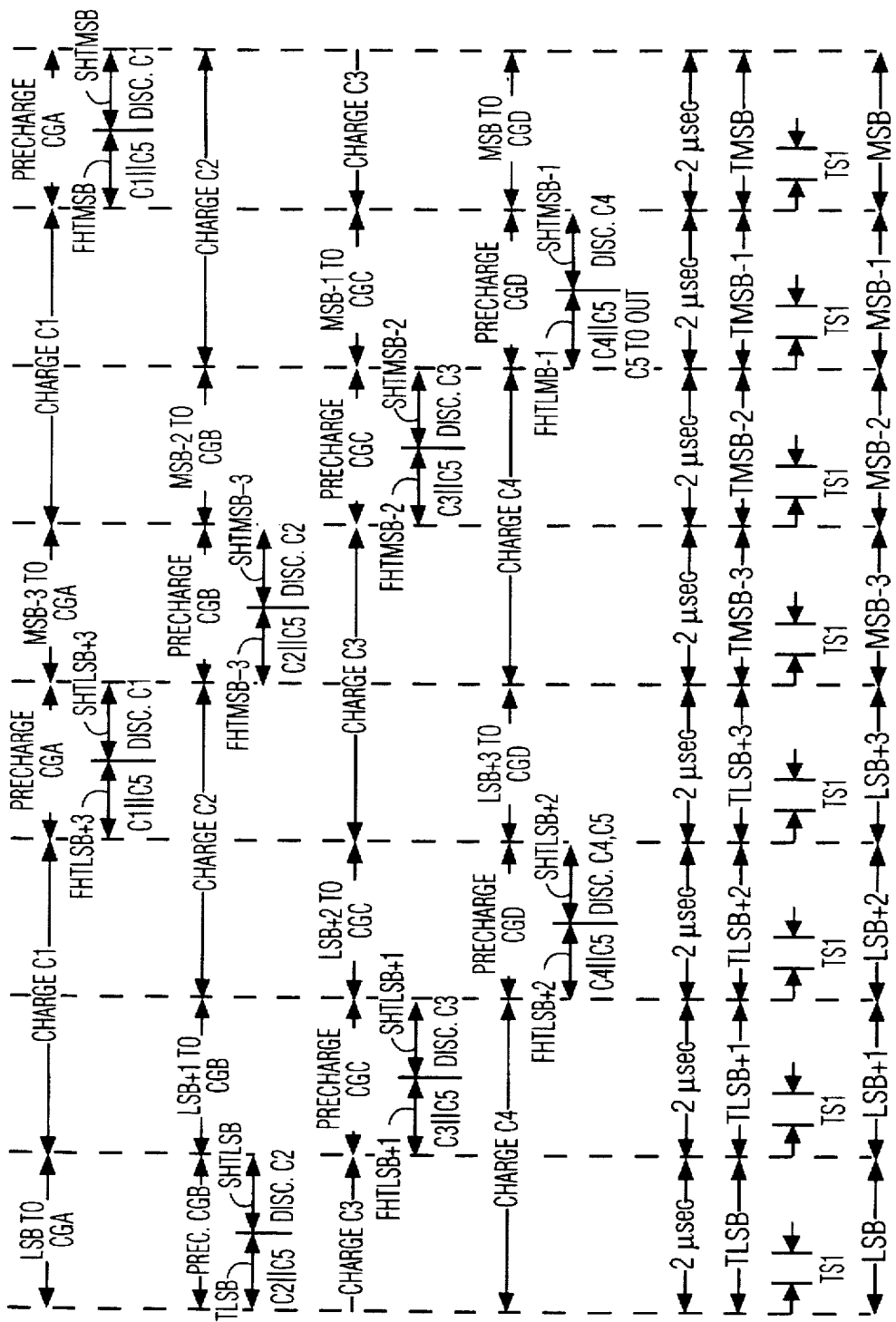

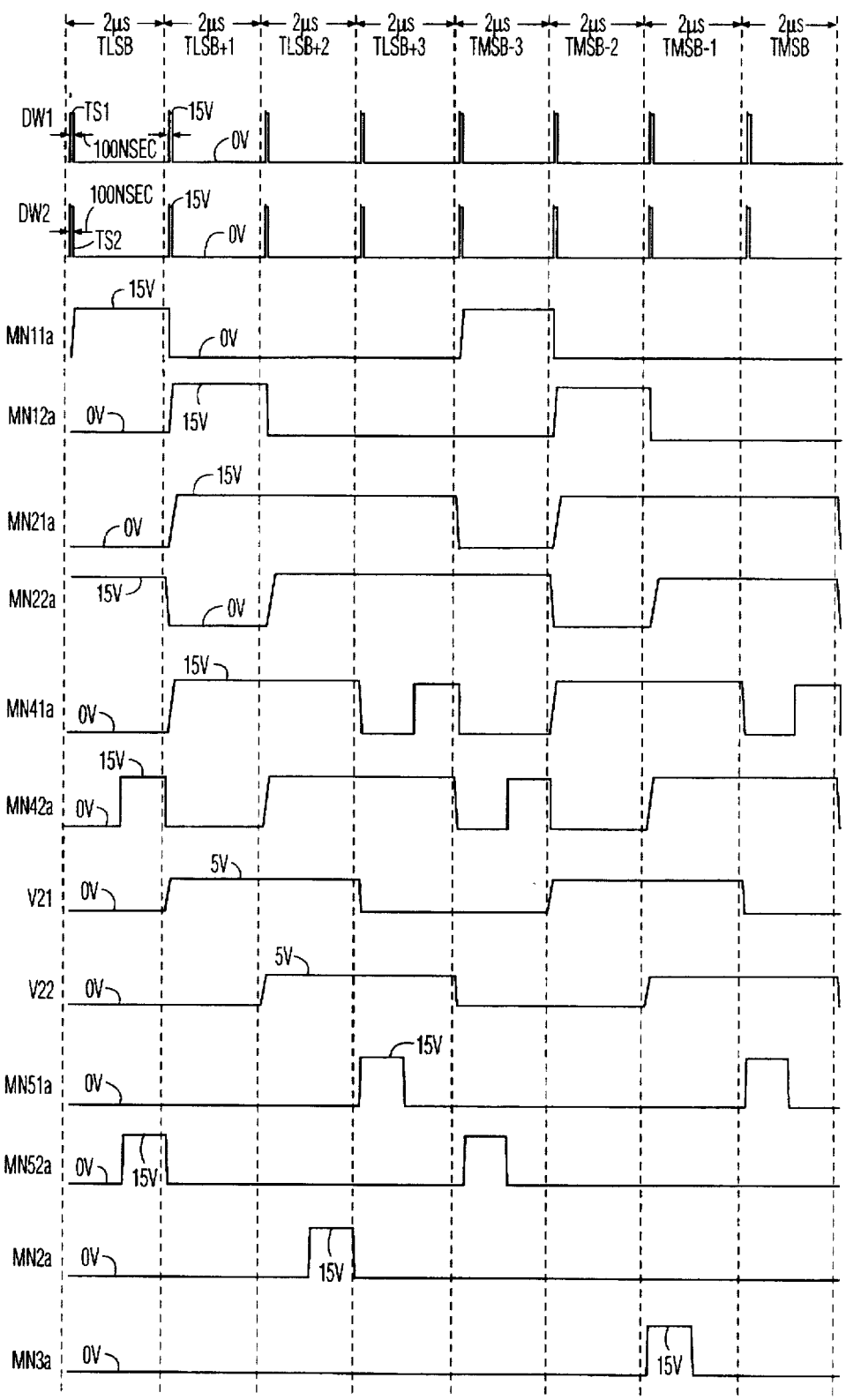

С,781,139

SWITCHED CAPACITOR DIGITAL-TO ANALOG CONVERTER

The invention relates generally to digital-to analog (D/A) converters and particularly to a D/A converter of the switched capacitor type.

Display devices, such as liquid crystal displays (LCD's), are composed of a matrix or an array of cells arranged, for example, horizontally in rows and vertically in columns. The video information to be displayed is provided to D/A converters in a form of, for example, a serial data word that is stored in a digital memory. The D/A converters produce from the corresponding data words analog brightness (gray scale) signals that are coupled to data lines which are individually associated with each column of pixels.

Amorphous silicon has been the preferable technology for fabricating liquid crystal displays because this material can be fabricated at low temperatures. Low fabrication temperature is important because it permits the use of standard, readily available and inexpensive substrate materials. However, the use of amorphous silicon thin film transistors (a-Si TFTs) in integrated peripheral pixel drivers causes design difficulties because of low mobility and the availability of only N-type metal oxide semiconductor (N-MOS) enhancement transistors.

U.S. Pat. No. 4,451,820 in the name of Kapral, entitled CHARGE REDISTRIBUTION INTEGRATABLE D/A CONVERTER, describes a D/A converter with switched capacitors of the charge redistribution type. In one example, each of the capacitors has the same value. Capacitors of the same value tend to track one another and stay equal. Therefore, any undesirable effect on the accuracy caused by capacitance variations due to aging, tolerances and environmental changes is, advantageously, reduced.

It may be desirable to construct a D/A converter with a-Si TFTs using equal capacitors having a cycle time is sufficiently fast for LCD purposes. For example, it may be desirable to attain a conversion cycle time of 16 μsec for an 8-bit, serial data word.

A digital-to-analog converter, embodying an aspect of the invention, includes a source of an input data word having a plurality of bits representing different weights. A plurality of capacitors of equal capacitance value include a first capacitor. A switching network is coupled to the capacitors and is responsive to the plurality of bits. The switching network initializes a charge in a respective capacitor of the plurality of capacitors that is associated with a given step of a plurality of steps, during a first interval of the given step. The switching network develops a charge in the charge initialized, associated capacitor, in accordance with a corresponding bit, during a second interval of the given step. The switching network couples, during a third interval of the given step, the associated capacitor to the first capacitor to combine in the first capacitor a charge of the first capacitor with the charge that is developed during the second interval, in the associated capacitor. A length of the second interval is unequal to a length of one of the first and third intervals.

FIGS. 2a–2e illustrate timing diagrams useful for explaining the operation of the D/A converter of FIGS. 1A and 1B.

FIGS. 3a–3n illustrate additional waveforms useful for explaining the operation of the D/A converter of FIGS. 1A and 1B.

Figure 1A:
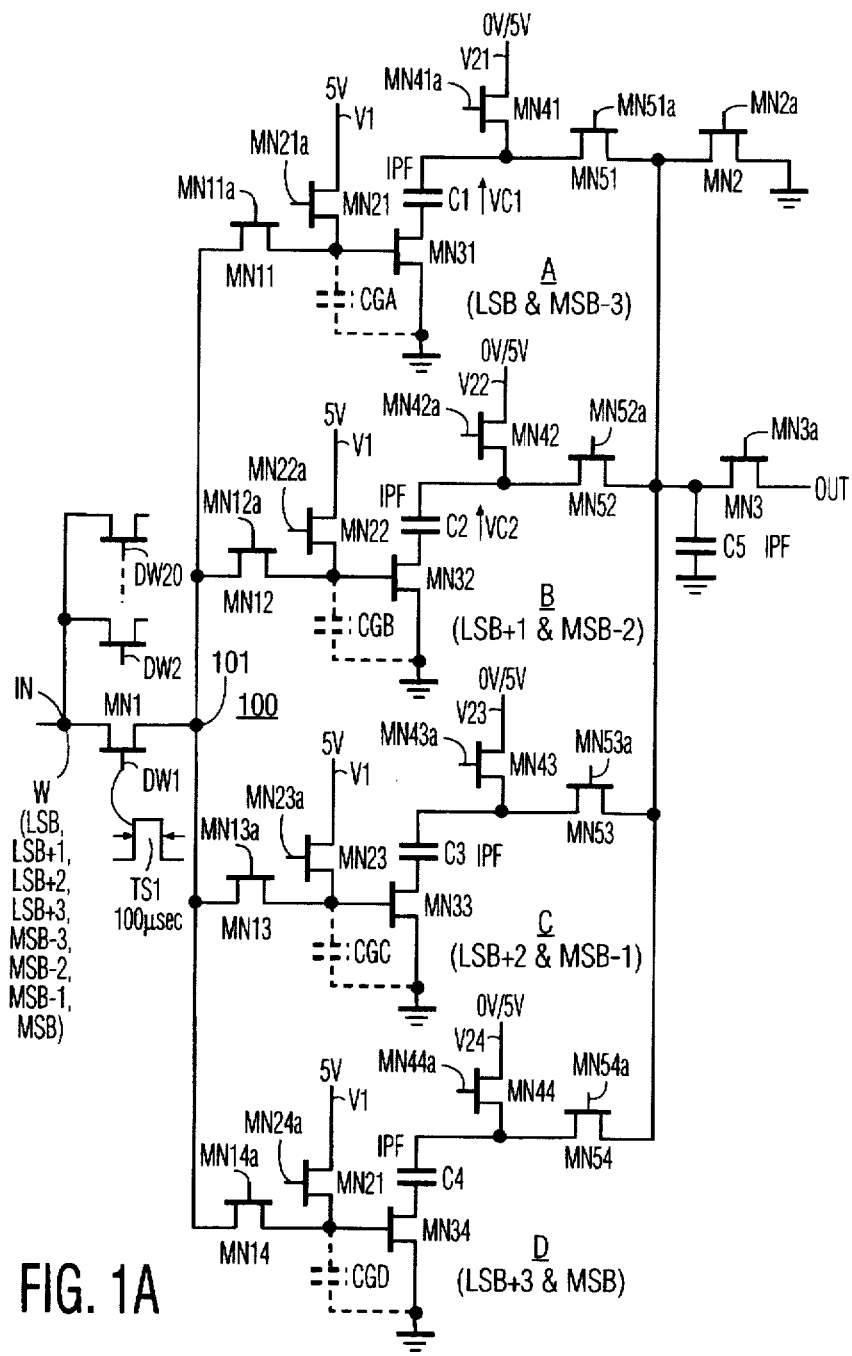
FIGS. 1A and 1B illustrate a switched capacitor type D/A converter, embodying an aspect of the invention.
Figure 1B:
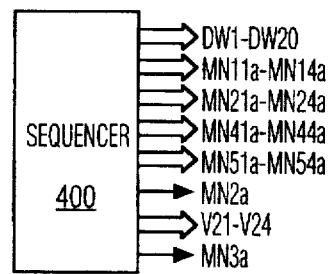

FIGS. 1A and 1B illustrate a D/A converter 100, embodying an aspect of the invention, for producing from a corresponding 8-bit serial word W a corresponding analog brightness voltage OUT. Transistor switches of D/A converter 100 of FIG. 1A are N-type amorphous silicon thin film transistors (a-Si TFTs) that are suitable for a display driver constructed on the same circuit board of an LCD matrix, not shown. The pixels of the LCD matrix are arranged in, for example, 1440 columns and 1024 rows. Therefore, the LCD matrix includes 1440 column lines that are applied with picture information by 1440 D/A converters 100, respectively. For the sake of simplicity, only one of such D/A converters 100 is shown in FIG. 1A. In a given row, the picture information is applied, during a given row select interval that is equal to, for example, 16 microsecond.

FIGS. 2a–2e and 3a–3n illustrate timing diagrams useful for explaining the operation of D/A converter 100 of FIG. 1A. Similar symbols and numerals in FIGS. 1A, 1B, 2a–2e and 3a–3n indicate similar items or functions.

An input terminal IN of FIG. 1A is common to each group of 20 D/A converters 100 of the 1440 D/A converters 100. In each of the group of 20 D/A converters, the 8 bits of word W of D/A converter 100, bits LSB, LSB+1, LSB+2, LSB+3, MSB–3, MSB–2, MSB–1 and MSB, listed in the order of weight or significance, are applied serially to data input terminal IN of FIG. 1A. Each of the 8 bits of word W is applied, during a corresponding 100 nanosecond time slot TS1. Eight time slots TS1 that correspond to bits LSB, LSB+1, LSB+2, LSB+3, MSB–3, MSB–2, MSB–1 AND MSB of word W occur in intervals TLSB, TLSB+1, TLSB+2, TLSB+3, TMSB–3, TMSB–2, TMSB–1 and TMSB, respectively, of FIG. 2e. There are 20 consecutive time slots TS1-TS20 in each interval TLSB, TLSB+1, TLSB+2, TLSB+3, TMSB–3, TMSB–2, TMSB–1 and TMSB, for applying 20 bits having the same weight to the 20 D/A converters 100, respectively, during each such interval. In FIG. 2a, time slot TS1 is shown and in FIG. 2b, time slot TS2 is shown. The other time slots are omitted for simplification purposes. Intervals TLSB, TLSB+1, TLSB+2, TLSB+3, TMSB–3, TMSB–2, TMSB–1 and TMSB of FIGS. 2a–2e and 3a–3k occur consecutively and each has a length of 2 microseconds.

A demultiplexer input transistor switch MN1 of FIG. 1A of each D/A converter 100 of the group of 20 D/A converters 100 is coupled to terminal IN. In each D/A converter 100, a corresponding control signal DWi of FIG. 1A, where i is selected from the numbers 1–20, is developed at a gate of transistor switch MN1. Thus, the corresponding bit of word W is coupled to a terminal 101 via transistor switch MN1, during the corresponding time slot TS1 of FIG. 2e.

D/A converter 100 of FIG. 1A includes four stages, A, B, C and D, that are substantially identical except for their timings that are staggered with respect to one another, as explained later on. Stages A, B, C and D form parallel branches to provide pipeline operation. Stages, A, B, C and D include a transistor switch MN11, a transistor switch MN12, a transistor switch MN13 and a transistor switch MN14, respectively, that form a 4:1 demultiplexer 102. Transistor switches MN11, MN12, MN13 and MN14 are coupled to terminal 101. Each of stages A, B, C and D operates in a given conversion cycle in first and second sub-cycles.

In the first sub-cycle in stage A, transistor switch MN11 that is controlled by a control signal MN11a of FIG. 3c couples bit LSB from terminal 101 of FIG. 1A to a gate electrode of a transistor switch MN31, during a corresponding time slot TS1 of interval TLSB of FIG. 2a. Consequently, a charge that was previously stored on the gate capacitance CGA of transistor switch MN31 of FIG.

1A, as explained later on, remains stored there when bit LSB is at the HIGH level. As a result, transistor switch MN31 remains conductive, during intervals TLSB+1 and TLSB+2 of FIG. 2a. When bit LSB of FIG. 2e is at the LOW level, transistor switch MN31 of FIG. 1A the aforementioned charge that was previously stored in capacitance CGA, as explained later, is discharged, causing transistor switch MN31 to be non conductive, during intervals TLSB+1 and TLSB+2 of FIG. 2a.

Transistor switch MN31 of FIG. 1A is coupled in series with a capacitor C1. Capacitor C1 is in a discharged state, prior to interval TLSB+1 of FIG. 2a, as explained later. During intervals TLSB+1 and TLSB+2, a transistor switch MN41 of FIG. 1A is turned on, in accordance with a control signal MN41a of FIG. 3g, and couples a voltage V21 of FIG. 3i at 5V to capacitor C1 of FIG. 1A. If transistor switch MN31 is conductive, as a result of bit LSB being at the HIGH level, capacitor C1 of FIG. 1A is charged to develop therein a voltage VC1 at 5V, during intervals TLSB+1 and TLSB+2 of FIG. 2a. If transistor switch MN31 is non conductive, as a result of bit LSB being at the LOW level, capacitor C1 of FIG. 1A stores no charge.

During interval TLSB+3 of FIG. 2a, a transistor switch MN21 of FIG. 1A is turned on, in accordance with a control signal MN21a of FIG. 3c, and precharges capacitance CGA of FIG. 1A. A voltage of 5V is developed on the gate of transistor MN31 causing transistor switch MN31 to conduct during an interval FHTLSB+3. Interval FHTLSB+3 occurs in the first half of interval TLSB+3 of FIG. 2a. During interval FHTLSB+3, transistor switch MN41 of FIG. 1A is turned off and a transistor switch MN52 that is controlled by a control signal MN51a of FIG. 3k is turned on for coupling capacitor C1 of FIG. 1A in parallel with a common summing capacitor C5. During an interval SHTLSB+3, in the second half of interval TLSB+3 of FIG. 2a, capacitor C1 of FIG. 1A is discharged. Capacitor C1 of FIG. 1A is discharged by conductive transistor switch MN41. Conductive transistor switch MN41 couples voltage V21 at 0V to capacitor C1, in preparation for the second sub-cycle in stage A.

In accordance with an inventive feature, the length of interval SHTLSB+3, allocated for discharging capacitor C1, is substantially shorter than the sum of the lengths of intervals TLSB+1 and TLSB+2, allocated for charging capacitor C1. During interval SHTLSB+3, transistor MN41 operates in a common source mode; whereas, during intervals TLSB+1 and TLBS+2, transistor MN41 operates in a source-follower mode. Because the conductivity of transistor MN41 in the common source mode is substantially higher than in the source follower mode, the length of the discharge interval SHTLSB+3 of capacitor C1 is made shorter than the sum of the lengths of the charge intervals TLSB+1 and TLSB+2. Advantageously, allocating intervals of different lengths for charging/discharging capacitor C1 facilitates a reduction in the length of the cycle time of D/A converter 100.

In accordance with another inventive feature, capacitor C1 is charged and discharged via the same transistor MN41. Thus, fewer transistors are coupled to capacitor C1. Consequently, the tolerance range of the sum of the capacitance of capacitor C1 and the parasitic capacitances associated with the transistors that are coupled in parallel with capacitor C1 is, advantageously, narrower.

During corresponding time slot TS1 of interval TMSB−3 of FIG. 2a, bit MSB−3 is coupled from terminal 101 of FIG. 1A to the gate electrode of transistor switch MN31, in the second sub-cycle in stage A. Similar operations occur in stage A and at the same order as in the first sub-cycle, as shown in FIG. 2a. Thus, during intervals TMSB−2 and TMSB−1, capacitor C1 FIG. 1A is charged by voltage V21 at 5V or remains discharged in accordance with bit MSB−3. Similarly, during interval TMSB, capacitance CGA is precharged. During an interval FHTMSB of FIG. 2a that is analogous to interval FHTLSB+3, capacitor C1 is coupled in parallel with capacitor C5 of FIG. 1A. During an interval SHTMSB that is analogous to interval SHTLSB+3, capacitor C1 is discharged by voltage V21 at 0V, in preparation for the immediately following first sub-cycle.

Similarly, stage B includes a transistor switch MN22, a transistor switch MN32, a transistor switch MN42, a transistor switch MN52, a gate capacitance CGB and a capacitor C2, that perform similar operations as transistor switches MN21, MN31, MN41 and MN51, gate capacitance CGA and capacitor C1, respectively, of stage A. A control signal MN12a of FIG. 3d, a control signal MN22a of FIG. 3f, a control signal MN42a of FIG. 3h, a control signal MN52a of FIG. 3l and a voltage V22 of FIG. 3j perform similar functions in stage B of FIG. 1A as control signals MN 11a, MN21a, MN41a, MN51a and voltage V21, respectively, in stage A.

Likewise, stage C includes a transistor switch MN23, a transistor switch MN33, a transistor switch MN43, a transistor switch MN53, a gate capacitance CGC and a capacitor C3, that perform similar operations as transistor switches MN21, MN31, MN41 and MN51, gate capacitance CGA and capacitor C1, respectively, of stage A. Likewise, a control signal MN13a, a control signal MN32a, a control signal MN43a, a control signal MN53a and a voltage V23, perform the similar functions in stage C as control signals MN11a, MN21a, MN41a, MN51a, and voltage V23, respectively, in stage A.

In a similar manner, stage D includes a transistor switch MN24, a transistor switch MN34, a transistor switch MN44, a transistor switch MN54, a gate capacitance CGD and a capacitor C4, that perform similar operations as transistor switches MN21, MN31, MN41 and MN51, gate capacitance CGA and capacitor C1, respectively, of stage A. Similarly, a control signal MN14a, a control signal MN24a, a control signal MN44a, a control signal MN54a and a voltage V24, perform the similar functions in stage D as control signals MN11a, MN21a, MN41a, MN51a, and voltage V21, respectively, in stage A. In each of stages B, C and D the conversion cycle includes first and second sub-cycles, as in the case of stage A.

In the first sub-cycle in stage B, transistor switch MN12 couples bit LSB+1 from terminal 101 to a gate electrode of transistor switch MN32, during corresponding time slot TS1 of interval TLSB+1 of FIG. 2b. In the second sub-cycle in stage B, transistor switch MN12 couples bit MSB−2 from terminal 101 to the gate electrode of transistor switch MN32, during a corresponding time slot TS1 of interval TMSB−2 of FIG. 2b. Similar operations occur in stage B of FIG. 1A and at the same order as in stage A, as shown in FIG. 2b, except for a delay of 2 microseconds.

Likewise, in the first sub-cycle in stage C, transistor switch MN13 couples bit LSB+2 from terminal 101 to a gate electrode of transistor switch MN33, during corresponding time slot TS1 of interval TLSB+2 of FIG. 2c. In the second sub-cycle in stage C, transistor switch MN13 couples bit MSB−1 from terminal 101 to the gate electrode of transistor switch MN33, during corresponding time slot TS1 of interval TMSB−1 of FIG. 2c. Similar operations occur in stage C of FIG. 1A and at the same order as in stage B, as shown in FIG. 2c, except for a further delay of 2 microseconds.

In the same way, in the first sub-cycle in stage D of FIG. 1A, transistor switch MN14 couples bit LSB+3 from terminal 101 to gate electrode of transistor switch MN34, during a corresponding time slot TS1 of interval TLSB+3 of FIG. 2d. In the second sub-cycle in stage D FIG. 1A, transistor switch MN14 couples bit MSB from terminal 101 to the gate electrode of transistor switch MN34, during corresponding time slot TS1 of interval TMSB of FIG. 2d. Similar operations occur in stage D of FIG. 1A and at the same order as in stage C, as shown in FIG. 2d, except for a still further delay of 2 microseconds.

As indicated before, each gate capacitance, CGA, CGB, CGC and CGD, of each transistor MN31, MN32, MN33 and MN34, respectively, is pre-charged, during the conversion cycle. Each gate capacitance, CGA, CGB, CGC and CGD, is pre-charged to develop a gate voltage of +5V, during a 2-microsecond interval that occurs immediately prior to the interval when the corresponding transistor switch MN11, MN12, MN 13 or MN14, is turned on. Therefore, advantageously, transistor switch MN11, MN12, MN13 or MN14 need not source a charge current when the bit of word W that is coupled to the gate of the corresponding transistor switch MN31, MN32, MN33 or MN34, respectively, is at the HIGH level. When the bit of word W is at the LOW level, the corresponding transistor switch MN11, MN12, MN 13 or MN14 is required to sink current, an operation that can be done faster than supplying current. In this way, advantageously, the transition time at the gate of each of transistor switches MN31, MN32, MN33 and MN34 is reduced.

A voltage VC5 in summing capacitor C5 is initialized to zero volts, during interval SHTLSB+2 of FIG. 2d. Discharging capacitor C5 is accomplished via a transistor switch MN2 of FIG. 1A that is controlled by a control signal MN2a of FIG. 3m. At all other times, during the conversion cycle, transistor switch MN2 of FIG. 1A is turned off. Thus, capacitor C5 is in a discharged state, prior to interval FHTLSB+3 of FIG. 2a of the first sub-cycle in stage A, as indicated before.

During interval FHTLSB+3 of FIG. 2a, any charge stored in capacitor C1 of FIG. 1A, in accordance with bit LSB, is redistributed between capacitors C1 and C5. If least significant bit LSB is at the HIGH level, the charge stored in capacitor C1 is redistributed in capacitors C1 and C5, during interval FHTLSB+3 of FIG. 2a. Capacitors C1, C2, C3, C4 and C5 of FIG. 1A are of equal value. Therefore, voltage VC5 developed in capacitor C5 is equal to one half that in capacitor C1. If least significant bit LSB is at the LOW level, capacitor C5 of FIG. 1A remains discharged, as explained before.

In accordance with a further inventive feature, the length of interval FHTLSB+3, allocated for charge redistribution in capacitors C1 and C5, is shorter than the sum of the lengths of intervals TLSB+1 and TLSB+2 allocated for charging capacitor C1. During interval FHTLSB+3, the change in voltage VC1 of capacitor C1 is less or equal to one half of voltage V21 or 2.5V. Whereas, during intervals TLSB+1 and TLSB+2, the change in voltage VC1 is greater or equal to 5V. Thus, the time required for charge redistribution is smaller than the time required for charging capacitor C1. Advantageously, allocating intervals of different lengths for charge redistribution in capacitor C1 and for charging capacitor C1 to 5V facilitates a reduction in the length of the cycle time of D/A converter 100.

During interval FHTMSB-3 of FIG. 2b, any charge stored in capacitor C2, in accordance with the level of bit LSB+1, is redistributed in capacitors C2 and C5 of FIG. 1A. The result is that the charge developed in capacitor C5 during interval FHTMSB-3 of FIG. 2b, is equal to one half the sum of the charge in capacitor C5 and the charge in capacitor C2 that are present at the end of interval TLSB+3 of FIG. 2a. Therefore, voltage VC5, that is developed during interval FHTMSB-3 of FIG. 2b, is equal to one half the sum of voltage VC5, and a voltage VC2 that are present at the end of interval TLSB+3 of FIG. 2a.

Similarly, during each of intervals FHTMSB-2, FHTMSB-1, FHTMSB, FHTLSB, FHTLSB+1 and FHTLSB+2 of FIGS. 2c, 2d, 2a, 2b, 2c and 2d, respectively, each capacitor C3, C4, C1, C2, C3 and C4 of FIG. 1A is coupled in parallel with common summing capacitor C5, as explained before. Any charge stored in each capacitor C3, C4, C1, C2, C3 and C4, in accordance with the level of each bit LSB+2, LSB+3, MSB-3, MSB-2, MSB-1 and MSB, respectively, is redistributed in such capacitor and in capacitor C5, in the manner explained before, thus, during each charge redistribution interval, the sum of the charge stored in capacitor C1, C2, C3 or C4 and the charge stored in summing capacitor C5 is divided by two. The result is that, during interval FHTLSB+2 of FIG. 2d, at the end of the conversion cycle, voltage VC5 of FIG. 1A is equal to the analog value equivalent of word W.

The resolution in bits of D/A converter 100 is equal to the number of charge transfers to capacitor C5. In the foregoing example, the resolution is eight bits. A transistor switch MN3 that is controlled by a control signal MN3a of FIG. 3n couples voltage VC5 of FIG. 1A to develop output voltage OUT. Voltage OUT of D/A converter 100 is applied via a corresponding data line driver, not shown, to a corresponding column line of an LCD matrix, not shown, in a well known manner, during interval FHTLSB+2 of FIG. 2d.

Advantageously, capacitors C1, C2, C3, C4 and C5 of FIG. 1A are of the same value such as 1 pf. Parametrically, they tend to track one another and stay equal. Consequently, any undesirable effect on the accuracy caused by capacitance variations due to aging, tolerances and environmental changes is, advantageously, reduced. In this way, data dependent errors that could have occurred due to charging and discharging of capacitors are, advantageously, reduced.

Control signals DW1–DW20, MN21a–MN24a, MN41a–MN44a, MN51a–MN54a, MN51a–MN54a, MN2a, MN3a and voltages V21–V24 of FIG. 1A are generated in a conventional sequencer 400 of FIG. 1B. The D/A conversion cycle time is equal to the sum of 8 intervals TLSB, TLSB+1, TLSB+2, TLSB+3, TMSB-3, TMSB-2, TMSB-1 and TMSB of FIG. 2e or 16 microsecond. The D/A conversion cycle time is made equal to the aforementioned of 16 microsecond row selection interval in the LCD matrix.

What is claimed is:

1. A digital-to-analog converter, comprising:

a source of an input data word having a plurality of bits representing different weights;

a plurality of capacitors of equal capacitance value including a first capacitor; and a switching network, coupled to said capacitors and responsive to said plurality of bits, for initializing a charge in a respective capacitor of said plurality of capacitors that is associated with a given step of a plurality of steps, during a first interval of said given step, said switching network developing a charge in said charge initialized, associated capacitor, in accordance with a corresponding bit, during a second interval of said given step and said switching network coupling, during a third interval of said given step, said associated capacitor to said first capacitor to combine in said first capacitor a charge of said first capacitor with said charge that is developed during said second interval, in said associated capacitor, such that a length of said second interval is unequal to a length of one of said first and third intervals.

2. A digital-to-analog converter according to claim 1 wherein said length of said second interval is unequal to said length of each of said first and third intervals.

3. A digital-to-analog converter according to claim 1 wherein said length of said one of said first and third intervals is shorter than said second interval in a manner to reduce a cycle time of said digital-to-analog converter.

4. A digital-to-analog converter according to claim 1 wherein said associated capacitor is coupled in parallel, with said first capacitor during said third interval.

5. A digital-to-analog converter according to claim 1 wherein a charge that was developed in said first capacitor in a preceding step is combined in said given step with said charge of said associated capacitor.

6. A digital-to-analog converter according to claim 1 wherein said plurality of capacitors includes a second capacitor that is associated with a second step, and wherein said switching network develops a charge, in accordance with a second bit, in said second capacitor and couples, in said second step, said second capacitor to said first capacitor to combine in said first capacitor said charge that was combined in said first capacitor in said given step with said charge in said second capacitor to provide for pipeline operation.

7. A digital-to-analog converter according to claim 1 wherein said bits are coupled serially to said switching network.

8. A digital-to-analog converter according to claim 1 wherein a first switch is coupled to a voltage source and to said associated capacitor for developing a predetermined voltage in said associated capacitor and a second switch couples said associated capacitor in parallel with said first capacitor.

9. A digital-to-analog converter, comprising:

a source of an input data word having a plurality of bits representing different weights;

a plurality of capacitors of equal capacitance value including a first capacitor; and a switching network, coupled to said capacitors and responsive to said plurality of bits, for initializing a charge in a respective capacitor of said plurality of capacitors that is associated with a given step of a plurality of steps, during a first interval of said given step and for developing a charge in said associated capacitor, in accordance with a corresponding bit, during a second interval of said given step, such that a common transistor switch of said switching network is coupled in a current path of said associated capacitor, during each of said first and second intervals, said switching network coupling said associated capacitor to said first capacitor to combine in said first capacitor a charge of said first capacitor with said charge that is developed in said associated capacitor.

* * * * *